United States Patent
Barry et al.

(10) Patent No.: US 8,987,067 B2
(45) Date of Patent: Mar. 24, 2015

(54) SEGMENTED GUARD RING STRUCTURES WITH ELECTRICALLY INSULATED GAP STRUCTURES AND DESIGN STRUCTURES THEREOF

(71) Applicant: International Business Machines Corporation, Armonk, NY (US)

(72) Inventors: Robert L. Barry, Essex Junction, VT (US); Phillip F. Chapman, Colchester, VT (US); Jeffrey P. Gambino, Westford, VT (US); Michael L. Gautsch, Jericho, VT (US); Mark D. Jaffe, Shelburne, VT (US); Kevin N. Ogg, Burlington, VT (US); Bradley A. Orner, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/782,537

(22) Filed: Mar. 1, 2013

(65) Prior Publication Data
US 2014/0246752 A1 Sep. 4, 2014

(51) Int. Cl.
*H01L 21/332* (2006.01)
*H01L 21/762* (2006.01)
*H01L 23/31* (2006.01)

(52) U.S. Cl.
CPC ....... *H01L 21/76267* (2013.01); *H01L 23/3171* (2013.01); *H01L 2924/0002* (2013.01)
USPC .......................................... 438/140; 257/508

(58) Field of Classification Search
CPC ........................ H01L 29/0619; H01L 29/0623
USPC ............................................................ 257/758
See application file for complete search history.

(56) References Cited

U.S. PATENT DOCUMENTS

| 4,688,063 | A | * | 8/1987 | Lu et al. ........................ 257/304 |
| 5,879,838 | A | | 3/1999 | Lee |
| 6,127,989 | A | | 10/2000 | Kunz |
| 6,465,283 | B1 | | 10/2002 | Chang et al. |
| 7,382,039 | B2 | | 6/2008 | Hollenbeck et al. |
| 7,466,284 | B2 | | 12/2008 | Barry |

(Continued)

FOREIGN PATENT DOCUMENTS

| CN | 101593745 A | 12/2009 |
| EP | 1071130 A2 | 1/2001 |

(Continued)

OTHER PUBLICATIONS

Chen et al., "Investigation on seal-ring rules for IC product reliability in 0.25-μm CMOS technology", Microelectronics Reliability 45 (2005), pp. 1311-1316, www.elsevier.com/locate/microrel.

(Continued)

*Primary Examiner* — Erik Kielin
(74) *Attorney, Agent, or Firm* — Anthony Canale; Roberts Mlotkowski Safran

(57) ABSTRACT

Disclosed are guard ring structures with an electrically insulated gap in a substrate to reduce or eliminate device coupling of integrated circuit chips, methods of manufacture and design structures. The method includes forming a guard ring structure comprising a plurality of metal layers within dielectric layers. The method further includes forming diffusion regions to electrically insulate a gap in a substrate formed by segmented portions of the guard ring structure.

10 Claims, 9 Drawing Sheets

(56) References Cited

U.S. PATENT DOCUMENTS

| | | | |
|---|---|---|---|
| 7,547,572 | B2 | 6/2009 | Carson et al. |
| 7,759,173 | B2 | 7/2010 | DeVries et al. |
| 8,169,055 | B2 | 5/2012 | Gillis et al. |
| 2002/0167071 | A1 | 11/2002 | Wang |
| 2004/0075174 | A1 | 4/2004 | Tamaru et al. |
| 2006/0092592 | A1 | 5/2006 | Huang |
| 2008/0061323 | A1* | 3/2008 | Yazawa et al. ............ 257/253 |
| 2008/0224174 | A1 | 9/2008 | Sasaki et al. |
| 2009/0160029 | A1 | 6/2009 | Pitts et al. |
| 2009/0294929 | A1 | 12/2009 | Lee et al. |
| 2010/0289110 | A1 | 11/2010 | Tarui et al. |
| 2012/0090398 | A1 | 4/2012 | Lee et al. |

FOREIGN PATENT DOCUMENTS

| | | |
|---|---|---|
| JP | 2001085630 A | 3/2001 |
| JP | 2008227116 A | 9/2008 |
| JP | 2009290191 A | 12/2009 |
| KR | 20010029950 A | 4/2001 |

OTHER PUBLICATIONS

U.S. Appl. No. 13/437,273, filed Apr. 2, 2012, not yet published, 21 pages.

International Search Report and Written Opinion for the related PCT Application No. PCT/IB2014/059347 dated Jul. 8, 2014, 15 pages.

\* cited by examiner

SEGMENTED GUARD RING STRUCTURES WITH ELECTRICALLY INSULATED GAP STRUCTURES AND DESIGN STRUCTURES THEREOF

FIELD OF THE INVENTION

The invention relates to semiconductor structures and methods of manufacture and, more particularly, to guard ring structures with an electrically insulated gap located in a substrate to reduce or eliminate device coupling of integrated circuit chips, methods of manufacture and design structures.

BACKGROUND

Guard rings are structures that prevent delamination of various layers of the integrated circuit chip and other edge damage which may occur during "dicing" operations, as well as protect the integrated circuit from moisture and ionic contamination. For example, during dicing operations, cracks that extend inwardly from the edges of a chip are halted by the guard ring, which is typically in the form of a metallic ring-like structure positioned between the active region of the chip and the edge of the chip.

More specifically, at a final stage of fabrication, the wafer is cut or diced into individual integrated circuit chips, either by sawing or by scribing and breaking. When diced by sawing or by scribing and breaking, the wafer is subjected to high shear stresses which can cause cracks to form, which extend inwardly from the sawn or scribed and broken edges of each chip. Due to the stresses encountered when dicing the chip or even later during use, cracks can propagate inward from the edges of the chip and eventually reach the active portion of the chip, damaging semiconductor devices within the active portion. The guard ring structure, though, will prevent propagation of the crack into the active region.

For RF devices, the continuous ring of metal can couple to the circuits, creating noise and degrading performance. Hence, it is desirable to have breaks in the guard ring (discontinuous metal) to minimize RF coupling. In such a structure, if the gap in the guard ring is small enough, cracks will not propagate into the active device. However, having a gap in the guard ring is not sufficient to eliminate device coupling, because of the conductivity of the silicon substrate.

SUMMARY

In an aspect of the invention, a method comprises forming a guard ring structure comprising a plurality of metal layers within dielectric layers. The method further comprises forming diffusion regions to electrically insulate a gap in a substrate formed by segmented portions of the guard ring structure.

In an aspect of the invention, a method comprises forming a discontinuous guard ring structure in dielectric layers by alternately depositing metal wirings and via structures surrounding an active area of a chip. The method further comprises forming diffusion regions in an underlying substrate layer to electrically insulate a gap formed in the substrate layer by segmented portions of the discontinuous guard ring structure.

In an aspect of the invention, a structure comprises a discontinuous guard ring structure in dielectric layers comprising a plurality of metal layers surrounding an active area of a chip. The structure further comprises a gap in an underlying substrate formed between segments of the discontinuous guard ring structure. The structure further comprises an electrically insulating structure within the gap to reduce or eliminate device coupling of integrated circuit chips.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the guard ring structures, which comprises the structures of the present invention. In still further embodiments, a method in a computer-aided design system is provided for generating a functional design model of the guard ring structures. The method comprises generating a functional representation of the structural elements of the guard ring structures.

In embodiments, a hardware description language (HDL) design structure is encoded on a machine-readable data storage medium. The HDL design structure comprises elements that when processed in a computer-aided design system generates a machine-executable representation of a guard ring structure with an electrically insulated gap. The guard ring structure with the electrically insulated gap comprises: a discontinuous guard ring structure in dielectric layers comprising a plurality of metal layers surrounding an active area of a chip; a gap in an underlying substrate formed between segments of the discontinuous guard ring structure; and an electrically insulating structure within the gap to reduce or eliminate device coupling of integrated circuit chips.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to guard ring structures with an electrically insulated gap located in a substrate to reduce or eliminate device coupling of integrated circuit chips, methods of manufacture and design structures. In more specific embodiments, the present invention relates to segmented or discontinuous guard ring structures with an electrically insulated gap located in a substrate (e.g., silicon). Advantageously, in any of the aspects of the present invention, the guard ring structure will prevent the propagation of cracks into active regions of integrated circuit chips. Also, the electrically insulated gap of the metal guard ring structure will reduce and/or eliminate coupling through the substrate.

In embodiments, the segmented guard ring structure comprises different configurations for different technologies. For example, the segmented guard ring structures can be implemented in SOI technologies, low resistivity bulk Si technologies and high resistivity Si technologies. In SOI technologies, the isolation is provided by diffusion regions in a substrate above the BOX layer. In low resistivity bulk Si technologies, the isolation is provided by p-n junctions. In high resistivity Si technologies, the isolation is provided by diffusions and an Ar (or other noble gas) implant in an epi layer. In embodiments, the electrically insulated gap is part of the structure of the segmented guard ring. In further embodiments, the electrically insulated gap can be perpendicular to the direction of the guard ring (which is parallel to the substrate surface).

Figure 1:
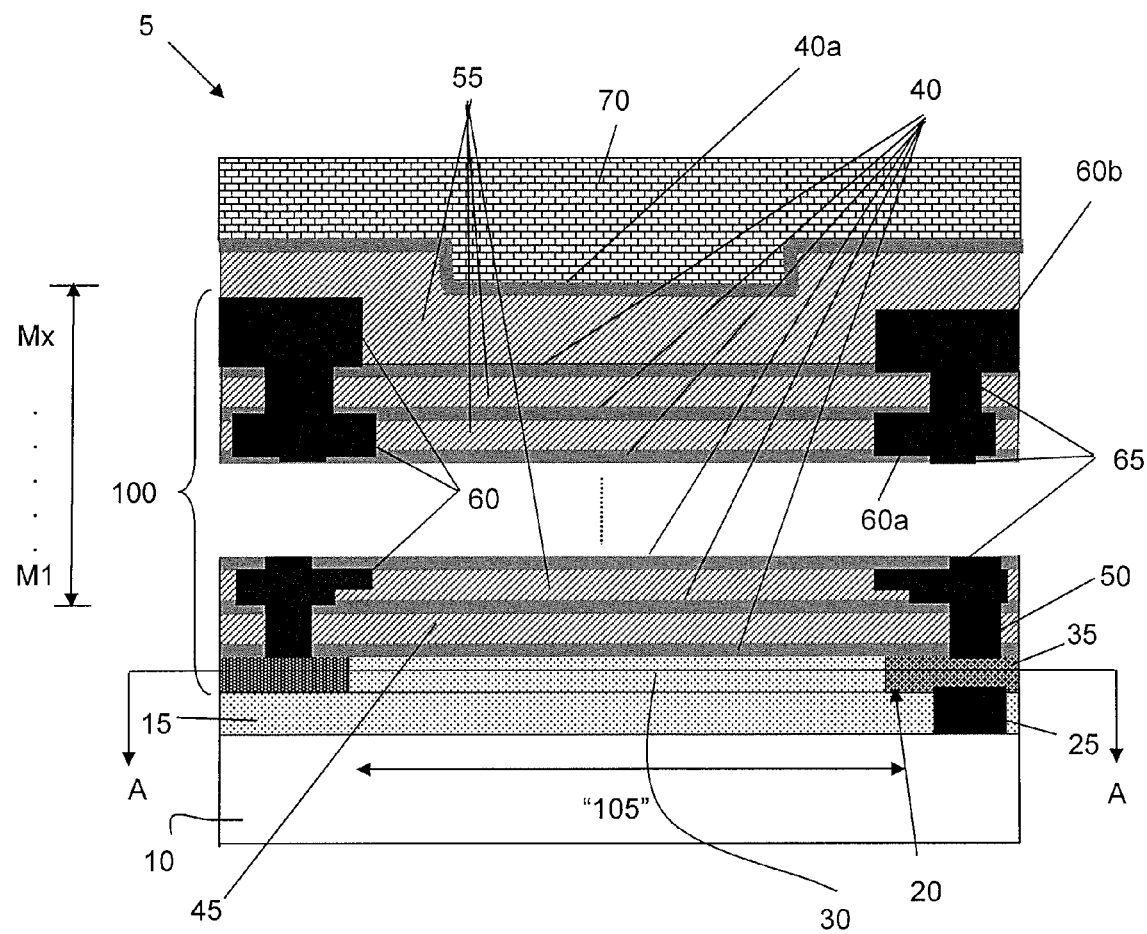
FIG. 1 shows a cross-sectional view of a segmented guard ring structure with an electrically insulated gap and respective processing steps, in accordance with aspects of the present invention.

FIG. 1 shows a cross-sectional view of a segmented guard ring structure with an electrically insulated gap and respective processing steps in accordance with aspects of the present invention. More specifically, FIG. 1 shows a structure 5 comprising a segmented guard ring structure 100 with an electrically insulated gap 105 in Silicon-On-Insulator (SOI) technology. In embodiments, the substrate is an SOI substrate which can be fabricated using any conventional processes such as, for example, SiMOX or other known bonding techniques.

By way of illustrative example, the substrate includes a buried oxide layer 15 sandwiched between a Si wafer 10 and a semiconductor layer 20. In embodiments, the semiconductor layer 20 can be any semiconductor material such as, for example, Si, SiGe, Ge, GaAs, as well as other III/V or II/IV compound semiconductors or any combinations thereof. In embodiments, a substrate contact 25 can optionally be formed in the buried oxide layer 20, using conventional drilling, deposition and polishing processes. For example, a hole can be drilled in the buried oxide layer 15 (through the layer 20), and then filled with a poly material. The surface of the structure can then undergo conventional polishing processes, e.g., chemical mechanical polishing (CMP). The poly material can be doped during the formation of P+ or N+ doped regions 35.

Still referring to FIG. 1, a shallow trench isolation structure (STI) 30 is formed in the semiconductor layer 20, using conventional lithography, etching and deposition methods. For example, a resist can be formed on the semiconductor layer 20, and exposed to energy to form a pattern (opening). The semiconductor layer 20 can then be etched through the pattern to form a trench, using conventional reactive ion etching (RIE) processes. An insulator material is deposited within the trench to form the STI 30. In embodiments, the insulator material can be, for example, oxide or other insulator material. The surface of the structure can then be subjected to polishing processes, e.g., CMP.

The P+ or N+ doped regions 35 are formed on the sides of the STI 30, in the semiconductor layer 20. For example, a resist is formed over the STI 30 and patterned to form openings over the underlying semiconductor layer 20, using conventional lithography processes. The exposed areas of the underlying semiconductor layer 20 then undergo an ion implantation and anneal process to form the P+ or N+ doped regions 35. In embodiments, any known dopant can be used to form the P+ or N+ doped regions 35, e.g., boron, arsenic or phosphorous. Annealing can be performed at any known temperature for any known time, e.g., annealing at 800° C. to 1150° C. for a few minutes. In this implementation, the P+ or N+ doped regions 35 will provide an electrical insulation within the gap 105 in order to reduce and/or eliminate device coupling due to the conductivity of the silicon substrate 10.

In FIG. 1, the guard ring structure is represented generally by reference numeral 100, and comprises, for example, the P+ or N+ diffusion regions 35, in addition to the subsequently formed contact structure 50, metal wirings 60 and vias 65 formed in a plurality of wiring levels depicted as M1 to Mx. It should be understood by those of skill in the art that any number of wiring levels are contemplated by the present invention.

In fabricating the contact structure 50, a barrier layer 40 is formed over the P+ or N+ diffusion regions 35 and STI 30. In embodiments, the barrier layer 40 can be a $Si_3N_4$, which is blanket deposited using a plasma enhanced chemical vapor deposition (PECVD) process. A BSPG layer 45 is then deposited on the $Si_3N_4$. In embodiments, the BSPG layer 45 provides a mobile ion barrier, e.g., blocks diffusions into any underlying layers. The contact structure 50 is formed in the BSPG layer 45 and the barrier layer 40, contacting the underlying P+ or N+ diffusion regions 35. In embodiments, the P+ or N+ diffusion regions 35 are formed using conventional lithography, etching and deposition processes, as already discussed herein. In embodiments, the contact structure 50 comprises tungsten; although other materials are also contemplated by the present invention. For example, the contact structure 50 can be aluminum or copper. The contact structure 50 will form a ground for the structure of the present invention.

In subsequent layers, additional barrier layers 40 and inter-level dielectric layers 55 are alternatively deposited using conventional deposition methods, e.g., CVD. In each of these layers, alternating metal wirings 60 and vias 65 are formed using conventional lithography, etching and deposition methods. In embodiments, the metal wirings 60 can be formed using a conventional dual damascene process; although, the metal wirings 60 can also be formed using a conventional single damascene process. The metal wirings 60 can be formed from aluminum or copper, for example. The vias 65, on the other hand, can be formed from aluminum, copper or tungsten. For example, the vias 65 can be aluminum or copper when the metal wirings 60 are aluminum or copper, respectively. In additional embodiments, the vias 65 can be tungsten, when an upper metal wiring 60a is aluminum or copper. The last metal wiring 60b is preferably aluminum. In embodiments, a polyimide layer 70 is deposited on the uppermost barrier layer 40a. As in each of the embodiments, back end of line (BEOL) processes can continue after deposition of the polyimide layer 70.

Figure 2:
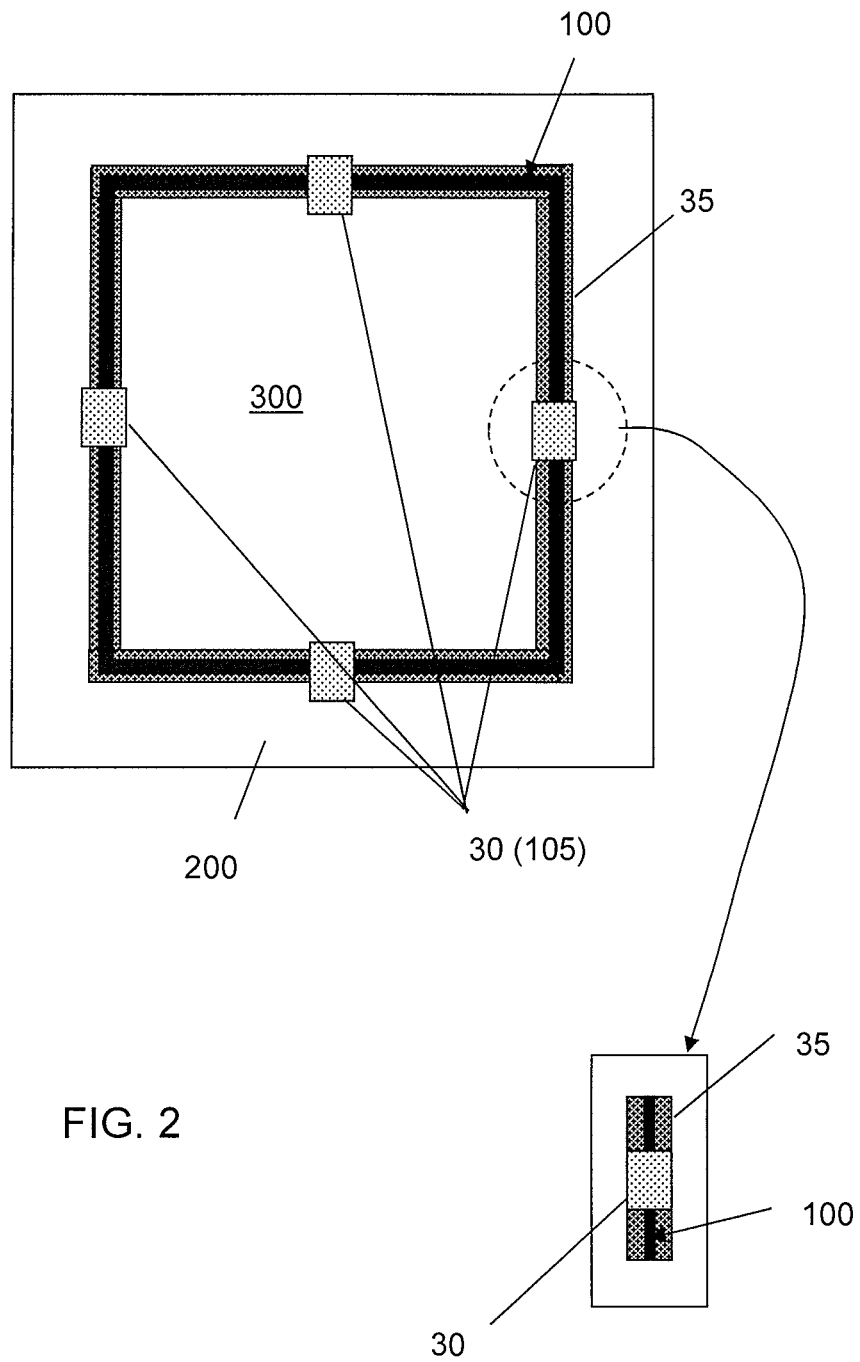
FIG. 2 shows a top view of the segmented guard ring structure with an electrically insulated gap of FIG. 1, along line A-A.

FIG. 2 shows a top view of the segmented guard ring structure with an electrically insulated gap of FIG. 1. More specifically, FIG. 2 shows a cross-sectional top view of the segmented guard ring structure, along line A-A of FIG. 1. In this representative view, the guard ring structure 100 is shown surrounding an active region 300. The active region 300 can include an array of semiconductor devices and wiring levels, separated from a kerf region 200 by the guard ring structure 100. As shown in FIG. 2, the guard ring structure 100 includes a gap (represented as reference numeral 105) at the STI regions 30, thus making it a discontinuous guard ring structure 100. As described with regard to FIG. 1, the discontinuous (or segmented) guard ring structure 100 includes the P+ or N+ diffusion regions 35. The optional substrate contacts 25 are also shown, in contact with the P+ or N+ diffusion regions 35.

Figure 3:
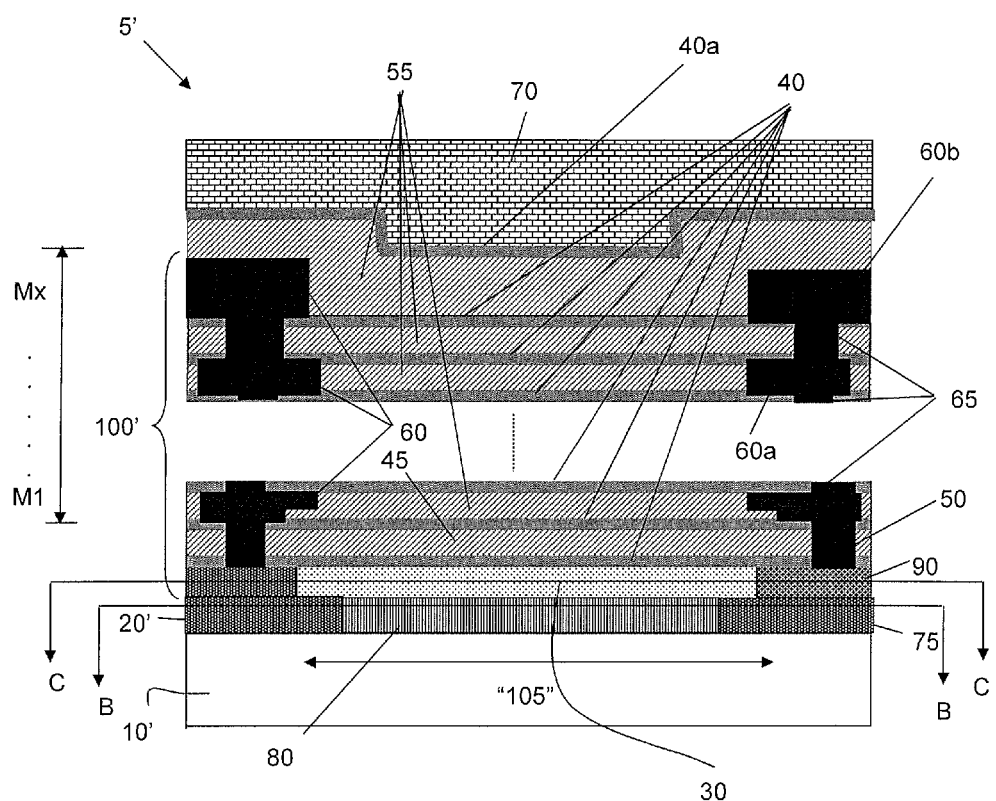
FIG. 3 shows a cross-sectional view of a segmented guard ring structure with an electrically insulated gap and respective processing steps in a low resistivity substrate, in accordance with additional aspects of the present invention.

FIG. 3 shows a cross-sectional view of a segmented guard ring structure with an electrically insulated gap and respective processing steps in a bulk substrate, in accordance with additional aspects of the present invention. More specifically, FIG. 3 shows a structure 5' comprising a segmented guard ring structure 100' with an electrically insulated gap 105 used in combination with a low resistivity a substrate 10', e.g., 50 ohm-cm resistivity or less. In embodiments, the substrate 10' may be a semiconductor layer of Si; although other BULK materials are also contemplated by the present invention. In this implementation, the guard ring structure 100' comprises, for example, diffusion regions 75, 80 and 90, in addition to subsequently formed contact structure 50, metal wirings 60 and vias 65 formed in a plurality of wiring levels depicted as M1 to Mx. It should be understood by those of skill in the art that any number of wiring levels are contemplated by the present invention.

In embodiments, the STI region 30 is formed in the substrate 10' using the processes as already described herein. The well diffusion regions 75 and well diffusion regions 80 are formed in the substrate 10' using deep well implants formed using known implantation processes. In embodiments, the well diffusion regions 80 are optional. The well diffusion regions 75 can be either n-wells or p-wells, and the well diffusion regions 80 would be an oppositely charged well region. For example, the well diffusion regions 75 can be n-wells formed using phosphorous or arsenic, in which case the well diffusion regions 80 are p-wells formed using arsenic. Alternatively, the well diffusion regions 75 can be p-wells formed using boron, in which case the well diffusion regions 80 are n-wells formed using arsenic.

In any scenario, diffusion regions 90 are formed in an upper portion of the substrate 10' using a shallow implant process. In embodiments, the diffusion regions 90 are P+ diffusion regions in contact with the underlying n-wells 75, or alternatively the diffusion regions 90 are an N+ diffusion regions in contact with underlying p-wells 75. In this implementation, the diffusion regions 75, 80 and 90 will provide an electrical insulation within the gap 105 in order to reduce and/or eliminate device coupling due to the conductivity of the substrate 10'.

The remaining structure is formed in a similar manner described with reference to FIG. 1. For example, the barrier layer 40 can be a $Si_3N_4$, which is blanket deposited using a chemical vapor deposition (CVD) process. A BSPG layer 45 is deposited on the $Si_3N_4$. A contact structure 50 is formed in the BSPG layer 45 and the barrier layer 40, contacting the underlying diffusion regions 90. In embodiments, the contact structure 50 comprises tungsten; although other materials are also contemplated by the present invention, e.g., aluminum or copper.

In subsequent layers, additional barrier layers 40 and inter-level dielectric layers 55 are alternatively deposited using conventional deposition methods, e.g., CVD. In each of these layers, alternating metal wirings 60 and vias 65 are formed using conventional lithography, etching and deposition methods. In embodiments, the metal wirings 60 can be formed using a conventional dual damascene process; although, the metal wirings 60 can also be formed using a conventional single damascene process. The metal wirings 60 can be formed from aluminum or copper, for example. The vias 65, on the other hand, can be formed from aluminum, copper or tungsten as already described herein. The last wiring layer 60b is preferably aluminum. In embodiments, a polyimide layer 70 can be deposited on the upper most barrier layer 40a.

Figure 4:
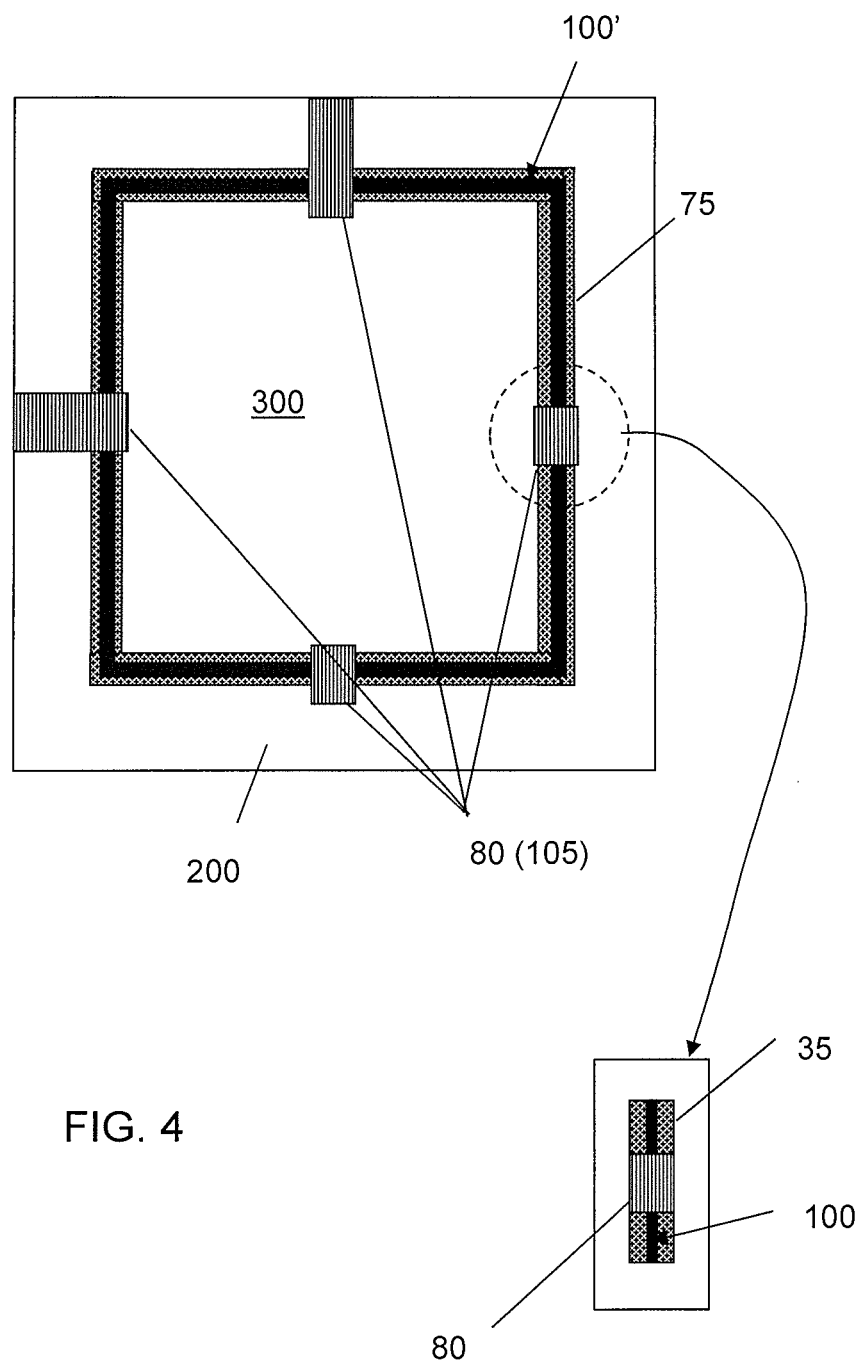
FIG. 4 shows a top view of the segmented guard ring structure with an electrically insulated gap of FIG. 3, along line B-B.

FIG. 4 shows a top view of the segmented guard ring structure with an electrically insulated gap of FIG. 3, along line B-B. In this representative view, the guard ring structure 100' is shown surrounding an active region 300. The active region 300 can include an array of semiconductor devices and wiring levels, separated from a kerf region 200 by the guard ring structure 100'. As shown in FIG. 4, the guard ring structure 100' includes a gap (represented as reference numeral 105) under the diffusion regions 80 (formed below the STI regions 30), thus making it a discontinuous (or segmented) guard ring structure 100'. In embodiments, one or more of the diffusion regions 80 can be extended to an edge of the kerf 200. As described with regard to FIG. 3, the discontinuous guard ring structure 100 includes the diffusion regions 75, 80 and 90, which will provide an electrical insulation within the gap 105 in order to reduce and/or eliminate device coupling due to the conductivity of the substrate.

Figure 5:
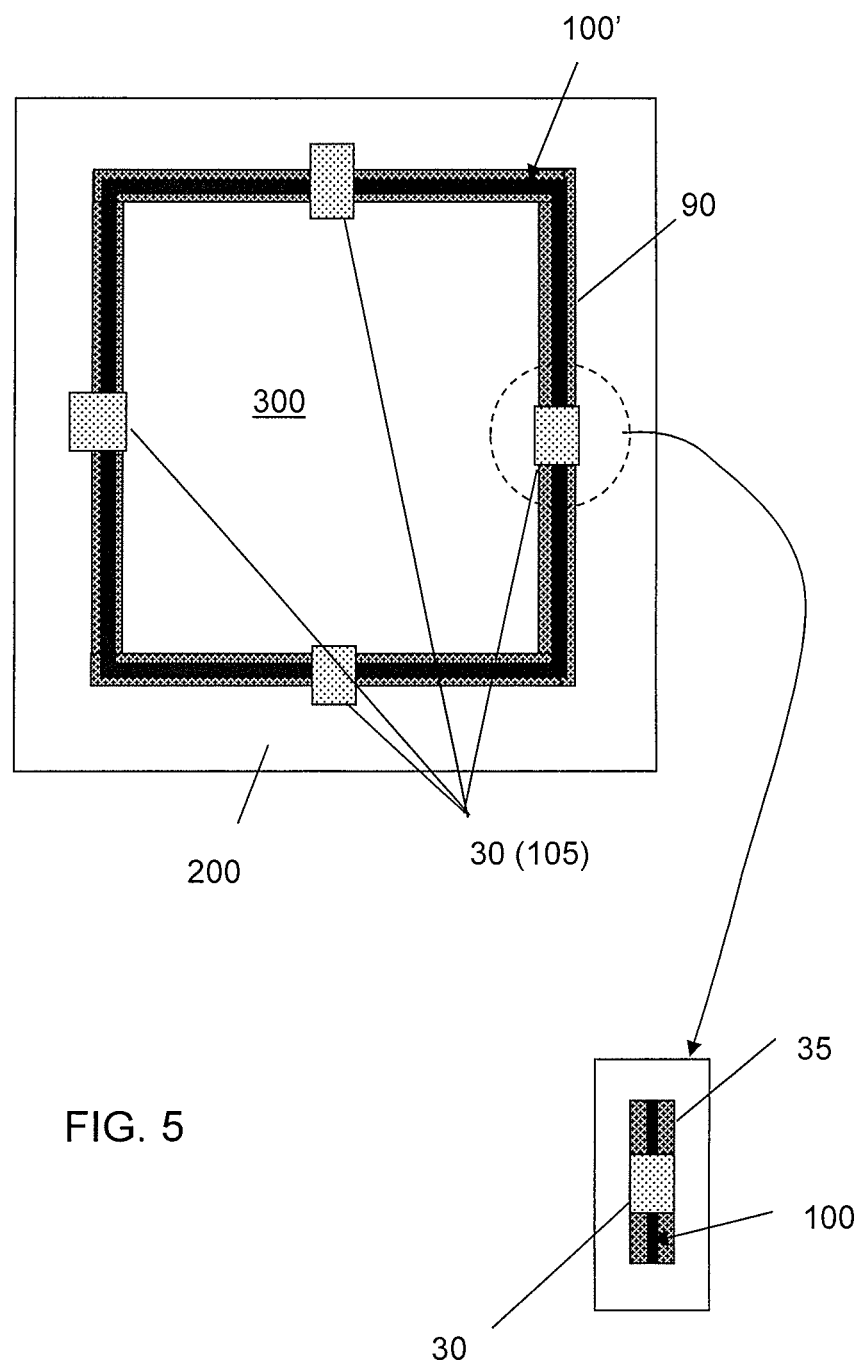
FIG. 5 shows a top view of the segmented guard ring structure with an electrically insulated gap of FIG. 3, along line C-C.

FIG. 5 shows a top view of the structure of FIG. 3, along line C-C. In this representative view, the guard ring structure 100' is shown separating the active region 300 from the kerf region 200. As shown in FIG. 5, the guard ring structure 100' includes a gap (represented as reference numeral 105) under the STI regions 30, thus making it a discontinuous (or segmented) guard ring structure 100'. The diffusion regions 90 are shown abutting directly against the STI regions 30. As should be understood, the diffusion regions 90 are provided directly on top of the diffusion regions 75 (not shown).

Figure 6:
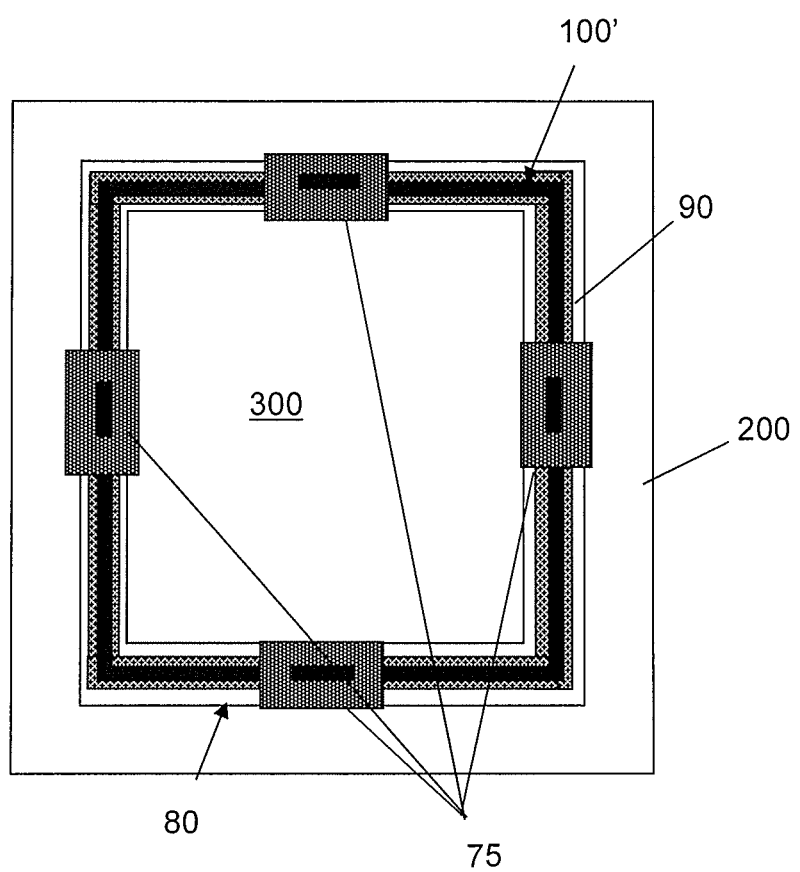
FIG. 6 shows an alternative or additional guard ring structure, in accordance with aspects of the present invention.

FIG. 6 shows an alternative or additional structure in accordance with aspects of the present invention. In this alternative or additional embodiment, the diffusion regions 90, e.g., p+ regions, can be formed directly on the substrate and more particularly directly on the p-well diffusion regions 80. In this way, the p-wells provide a stable ground potential across the chip. In embodiments, the structure shown in FIG. 6 can be combined with the structure shown in FIG. 4 (shown in another cross-sectional view).

Figure 7:
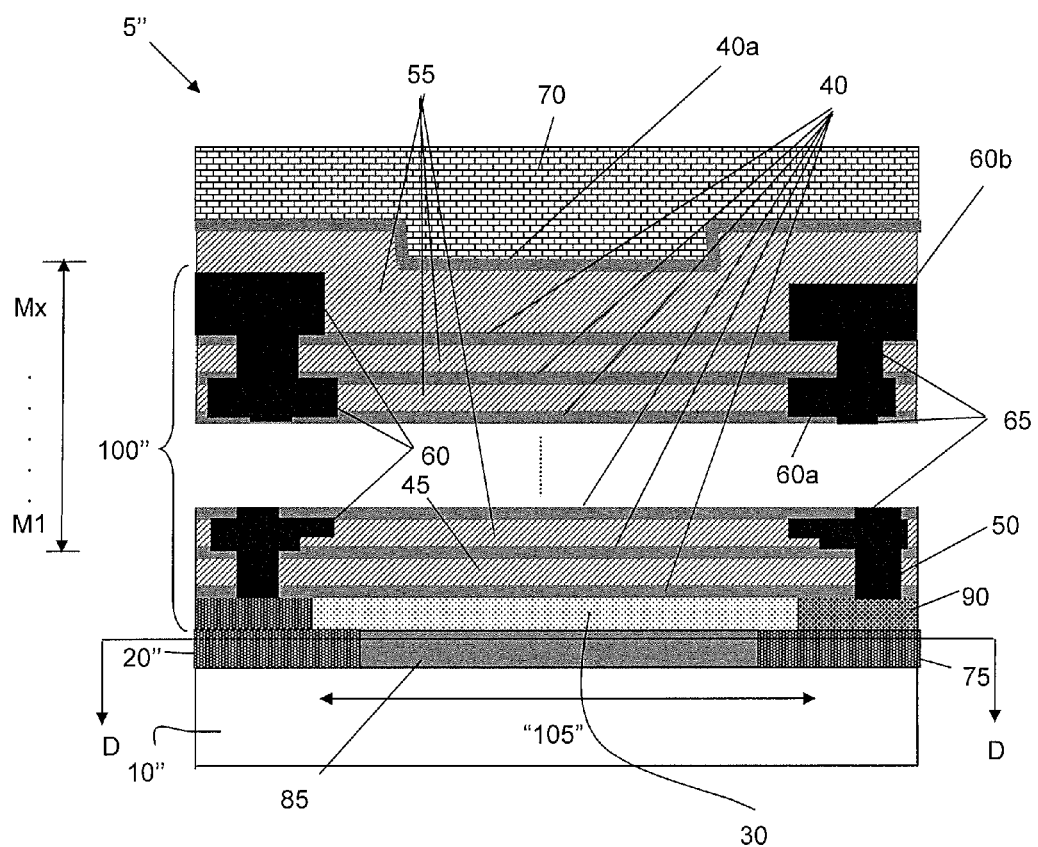
FIG. 7 shows a cross-sectional view of a segmented guard ring structure with an electrically insulated gap and respective processing steps in a high resistivity substrate, in accordance with additional aspects of the present invention.

FIG. 7 shows a cross-sectional view of a segmented guard ring structure with an electrically insulated gap and respective processing steps in a high resistivity substrate, in accordance with additional aspects of the present invention. More specifically, FIG. 7 shows a structure 5" comprising a segmented guard ring structure 100" with an electrically insulated gap 105 in a substrate 10" of high resistivity substrate, with resistivity much greater than 50 ohm-cm resistivity, e.g., P-type high resistivity. In embodiments, the structure of FIG. 7 can be implemented in BULK technologies using an epi substrate 20". In embodiments, the epi substrate 20" can be a Si substrate; although other high resistivity materials are also contemplated by the present invention.

In FIG. 7, the guard ring structure 100" comprises, for example, diffusion regions 75' and 90' with a noble gas, e.g., argon, implant region 85, under an STI region 30, in addition to contact structure 50, metal wirings 60 and vias 65 formed in a plurality of wiring levels depicted as M1 to Mx. As with other embodiments, any number of wiring levels is contemplated by the present invention.

In embodiments, the well diffusion regions 75 and 90 are formed in the epi layer of substrate material 20" formed on the substrate 10". In embodiments, the epi layer of substrate material 20" can be a semiconductor material, e.g., Si, epitaxially grown on the substrate 10". In embodiments, the well diffusion regions 75' are preferably p-wells, and the well diffusion regions 90 are preferably P+ regions, both of which are formed in the substrate material 20". In this implementation, the diffusion regions 75' and 90' can be formed using conventional ion implantation processes as described herein, and will provide an electrical insulation within the gap 105 in order to reduce and/or eliminate device coupling due to the conductivity of the substrate 10'. In embodiments, due to an inadvertent doping in the substrate material 20", argon or other noble gas can be implanted below the STI region 30, between the diffusion regions 75', to form implant region 85 within the gap 105.

The remaining structure is formed in a similar manner described with reference to FIGS. 1 and 3. For example, the barrier layer 40 can be a $Si_3N_4$, which is blanket deposited using a chemical vapor deposition (CVD) process. A BSPG layer 45 is then deposited on the $Si_3N_4$. A contact structure 50 is formed in the BSPG layer 45 and the barrier layer 40, contacting the underlying diffusion region 90. In embodiments, the contact structure 50 comprises tungsten; although other materials are also contemplated by the present invention, e.g., aluminum or copper. In subsequent layers, additional barrier layers 40 and interlevel dielectric layers 55 are alternatively deposited using conventional deposition methods, e.g., CVD. In each of these layers, alternating metal wirings 60 and vias 65 are formed using conventional lithography, etching and deposition methods as already described herein. The metal wirings 60 can be formed from aluminum or copper, for example; whereas, the vias 65, on the other hand, can be formed from aluminum, copper or tungsten as already described herein. The last wiring layer 60*b* is preferably aluminum. In embodiments, a polyimide layer 70 can be deposited on the upper most barrier layer 40*a*.

Figure 8:
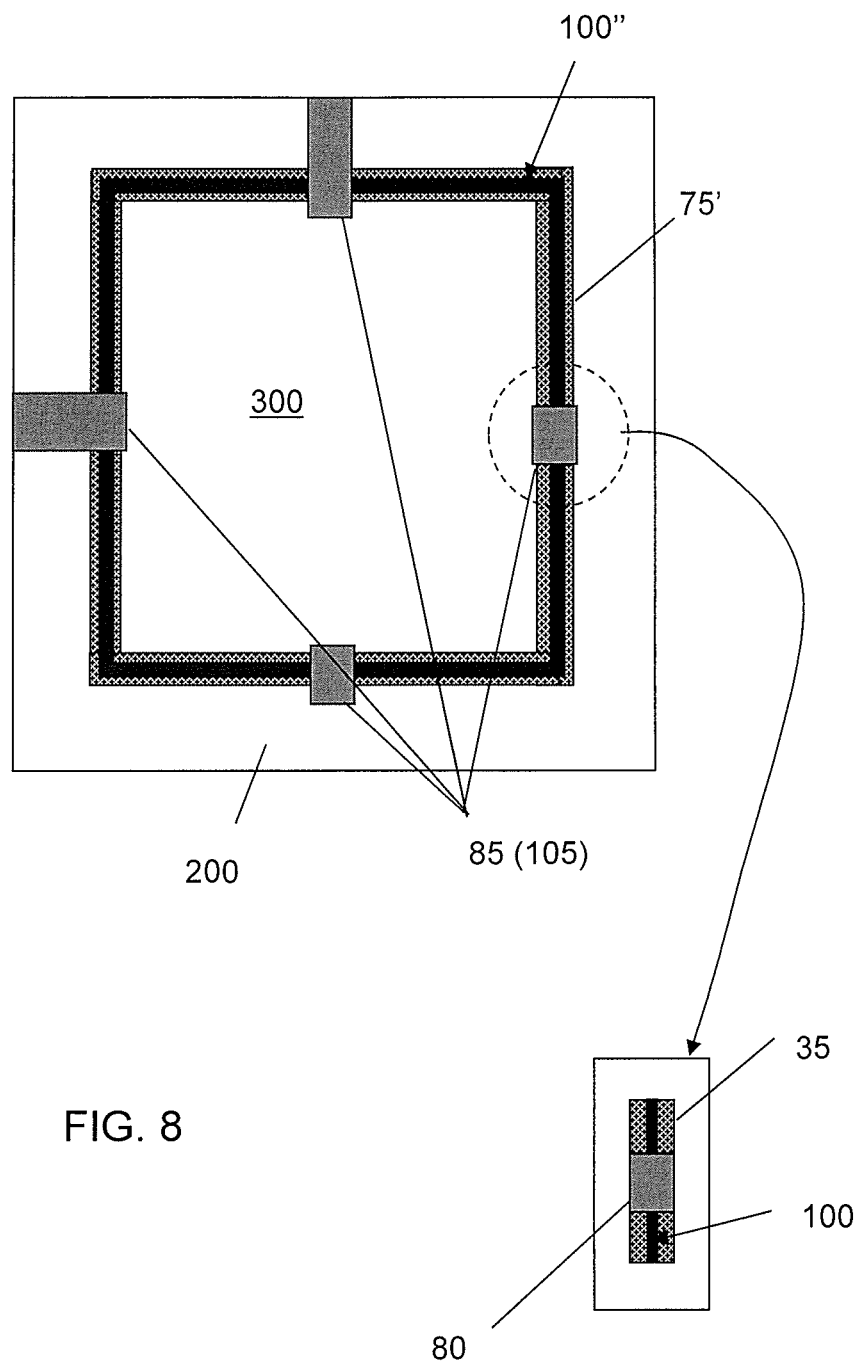
FIG. 8 shows a top view of the segmented guard ring structure with an electrically insulated gap of FIG. 7, along line D-D.

FIG. 8 shows a top view of the segmented guard ring structure with an electrically insulated gap of FIG. 7, along line D-D. In this representative view, the guard ring structure 100' is shown surrounding an active region 300. The active region 300 can include an array of semiconductor devices and wiring levels, separated from a kerf region 200 by the guard ring structure 100". As shown in FIG. 8, the guard ring structure 100" includes a gap (represented as reference numeral 105) at the implant regions 85 (formed below the STI regions 30), thus making it a discontinuous (or segmented) guard ring structure 100". In embodiments, one or more of the implant regions 85 can be extended to an edge of the kerf 200. Also, in additional or alternative embodiments, the implant regions 85 can be formed in direct contact with the substrate 10", while surrounding the p-well regions 75".

Figure 9:
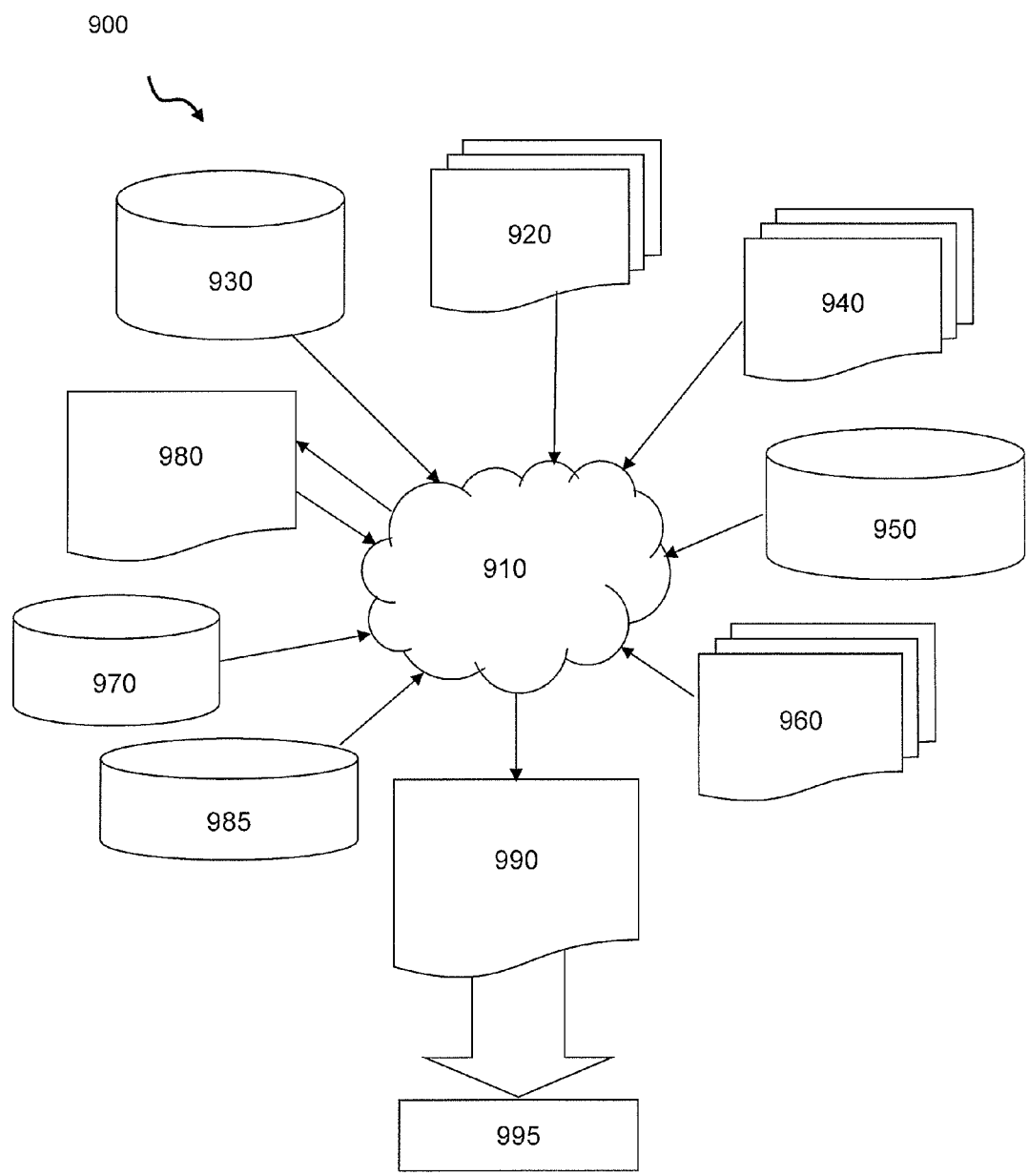
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a guard ring structure comprising a plurality of metal layers within dielectric layers; and
   forming diffusion regions to electrically insulate a gap in a substrate formed by segmented portions of the guard ring structure, wherein
   the diffusion regions are formed in a high resistivity substrate, and
   a noble implant region is implanted into the high resistivity substrate, below a shallow trench isolation (STI) structure.

2. The method of claim 1, wherein the diffusion regions are formed in a silicon on insulator (SOI) substrate using an ion implantation process.

3. The method of claim 2, wherein the diffusion regions are formed abutting edges of the shallow trench isolation (STI) structure formed in the SOI substrate.

4. The method of claim 3, wherein the diffusion regions are formed in direct contact with the metal layers of the guard ring structure.

5. The method of claim 1, further comprising forming the noble implant region in the high resistivity substrate between the diffusion regions.

6. The method of claim 1, wherein the noble implant region comprises implanting argon into the high resistivity substrate, below the STI structure.

7. The method of claim 1, wherein the high resistivity substrate is formed by growing an epitaxial layer on a bulk substrate.

8. A method, comprising:
   forming a guard ring structure comprising a plurality of metal layers within dielectric layers; and
   forming diffusion regions to electrically insulate a gap in a substrate formed by segmented portions of the guard ring structure; and forming additional diffusion regions in the high resistivity substrate using a shallow ion implantation process, wherein the diffusion regions are formed in a high resistivity substrate, and the high resistivity substrate is formed by growing an epitaxial layer on a bulk substrate.

9. A method, comprising:

forming a discontinuous guard ring structure in dielectric layers by alternately depositing metal wirings and via structures surrounding an active area of a chip; and forming diffusion regions in an underlying substrate layer to electrically insulate a gap formed in the substrate layer by segmented portions of the discontinuous guard ring structure, wherein the diffusion regions are formed in a high resistivity substrate and a noble gas implant process forms a noble gas implant region between the diffusion regions in the high resistivity substrate, and the high resistivity substrate is formed by growing an epitaxial layer on a bulk substrate.

10. The method of claim 9, wherein:

the substrate is a silicon on insulator (SOI) substrate;

the diffusion regions are formed using an ion implantation process;

the diffusion regions are formed abutting edges of a shallow trench isolation (STI) structure formed in the SOI substrate; and the diffusion regions are formed in direct contact with the metal layers of the discontinuous guard ring structure.

* * * * *